(12) United States Patent
Hu et al.

(10) Patent No.: US 10,483,130 B2
(45) Date of Patent: Nov. 19, 2019

(54) WIRE AND METHOD FOR MANUFACTURING THE SAME

(71) Applicant: Kunshan New Flat Panel Display Technology Center Co., Ltd., Jiangsu (CN)

(72) Inventors: Kun Hu, Jiangsu (CN); Li Lin, Jiangsu (CN); Qi Shan, Jiangsu (CN); Shixing Cai, Jiangsu (CN); Xiaolong Yang, Jiangsu (CN); Shengfang Liu, Jiangsu (CN)

(73) Assignee: KUNSHAN NEW FLAT PANEL DISPLAY TECHNOLOGY CENTER CO., LTD., Jiangsu (CN)

( * ) Notice: Subject to any disclaimer, the term of this patent is extended or adjusted under 35 U.S.C. 154(b) by 0 days.

(21) Appl. No.: 16/062,489

(22) PCT Filed: Feb. 27, 2017

(86) PCT No.: PCT/CN2017/075070
§ 371 (c)(1),
(2) Date: Jun. 14, 2018

(87) PCT Pub. No.: WO2017/152793
PCT Pub. Date: Sep. 14, 2017

(65) Prior Publication Data
US 2018/0366345 A1    Dec. 20, 2018

(30) Foreign Application Priority Data

Mar. 9, 2016   (CN) .......................... 2016 1 0132850

(51) Int. Cl.
*H01L 21/48* (2006.01)
*H01L 23/00* (2006.01)
(Continued)

(52) U.S. Cl.
CPC .......... *H01L 21/4896* (2013.01); *H01L 23/49* (2013.01); *H01L 24/43* (2013.01);
(Continued)

(58) Field of Classification Search
CPC ..... H01L 21/4896; H01L 21/48; H01L 23/49; H01L 24/43; H01L 51/52
See application file for complete search history.

(56) References Cited

U.S. PATENT DOCUMENTS 9,276,055 B1      3/2016  Son et al.
2011/0278550 A1  11/2011  Ha
(Continued)

FOREIGN PATENT DOCUMENTS

CN    201788721 U    4/2011
CN    103730476 A    4/2014
(Continued)

*Primary Examiner* — Hoa C Nguyen
*Assistant Examiner* — Amol H Patel
(74) *Attorney, Agent, or Firm* — Baker & Hostetler LLP

(57) ABSTRACT

A wire and a method of manufacturing are provided the wire for use in an organic light emitting diode device includes three parts, a first part and a third part are located at both ends of the wire respectively and each of the first part and the third part is a single wire, a second part is located between the first part and the third part, and the second part is a composite wire, wherein the composite wire comprises at least two wires. By dividing a middle part of one wire into multiple wires, the purpose of changing a wire width of a single wire is achieved, ductility of the wire can be enhanced, thereby avoiding the occurrence of the problem that the device cannot normally work caused by wire fracture during folding, and improving the using efficiency of the device.

15 Claims, 2 Drawing Sheets

(51) Int. Cl.
*H01L 51/52* (2006.01)
*H01L 23/49* (2006.01)

(52) U.S. Cl.
CPC .............. *H01L 24/45* (2013.01); *H01L 51/52* (2013.01); *H01L 2224/432* (2013.01); *H01L 2224/45005* (2013.01); *H01L 2224/45012* (2013.01)

(56) References Cited

U.S. PATENT DOCUMENTS

| | | |
|---|---|---|
| 2014/0055702 A1 | 2/2014 | Park et al. |
| 2014/0118975 A1 | 5/2014 | Chen et al. |
| 2014/0217373 A1 | 8/2014 | Youn et al. |
| 2016/0066409 A1 | 3/2016 | Kwon et al. |

FOREIGN PATENT DOCUMENTS

| | | |
|---|---|---|
| CN | 105047676 A | 11/2015 |
| CN | 205406511 U | 7/2016 |
| JP | 2009259929 A | 11/2009 |
| TW | 394255 B | 4/2013 |
| TW | 453520 B | 9/2014 |
| TW | 514423 B | 12/2015 |
| WO | 2016032175 A1 | 3/2016 |

WIRE AND METHOD FOR MANUFACTURING THE SAME

CROSS REFERENCE

This application is a National Stage of International patent application PCT/CN2017/075070, filed on Feb. 27, 2017, which claims priority to foreign Chinese patent application No. 201610132850.6, filed on Mar. 9, 2016, the disclosures of which are incorporated by reference in their entirety.

FIELD OF THE INVENTION

The disclosure relates to the technical field of thin film transistor backplane, and in particular to a wire and a method for manufacturing a wire.

BACKGROUND

An organic light-emitting diode (OLED for short) is considered to be one of the most promising display technologies for its characteristics such as high luminance, wide viewing angle, lower power consumption and wide working temperature. One of the biggest advantages of an OLED device, as a fully-cured display device, is that it can achieve flexible display, and can be used to manufacture a foldable electronic newspaper, a rollable wall-hanging television and a wearable display and so on, so as to exhibit fascinations of organic semiconductors.

In practical applications, the thin film transistor backplane of the OLED device includes a plurality of circuits, and different circuits are connected by wires. However, as for the manufactured OLED devices, such as the foldable electronic newspaper, the rollable wall-hanging television and the wearable display, the wire will be bent at portions where need to be folded. Although the wire itself has a certain degree of ductility, too long time of folding or too many times of folding will crack the wire. Once the wire fractures, normal use of the entire OLED device will be affected.

At present, in order to solve the above problem, the whole industry proposes a method in which the wires are fixed on the thin film transistor backplane by employing a manner of drilling holes and fixing. However, in practical applications, such manner is still hard to avoid the problem of wire fracture during folding.

SUMMARY OF THE INVENTION

In view of the above, the embodiments of the disclosure provide a wire and a method of manufacturing the same, aiming to solve the problem of OLED device unable to be normally used during folding due to wire fracture which is inevitable in the prior art.

A wire for use in an organic light-emitting diode (OLED) device comprises three parts, wherein a first part and a third part are located at both ends of the wire respectively and each of the first part and third part is a single wire; a second part is located between the first part and the third part and is a composite wire, wherein the composite wire comprises at least two sub-wires.

Optionally, a shape of each sub-wire in the composite wire is a smooth curve.

Optionally, the shapes of the sub-wires in the composite wire comprise one or more shapes selected from a group consisting of a circular arc shape, a sinusoid shape and a wave shape.

Optionally, the total wire width of the sub-wires in the composite wire is or is not the same as the wire width of the single wire.

A method of manufacturing a wire comprises: for a target wire, selecting a part with a predetermined first length of the target wire from a starting end as a first part of the wire;

from a finishing end of the first part, according to a predetermined wire width, cutting a part with a predetermined second length of the target wire into at least two sub-wires satisfying the predetermined wire width to obtain a second part of the wire, wherein the wire widths of the at least two sub-wires are the same or different;

at finishing ends of the at least two sub-wires, combining the finishing ends of the at least two sub-wires into one wire with a predetermined third length to obtain a third part of the wire.

In the disclosure, unless otherwise stated, the term "target wire" refers to a target wire that is used to manufacture the wire of the disclosure.

Optionally, when cutting a part with a predetermined second length of the target wire into the at least two sub-wires satisfying the predetermined wire width is performed, the method further comprises:

making the at least two sub-wires obtained by cutting into smooth curves.

Optionally, shapes of the at least two sub-wires comprise one or more shapes selected from a group consisting of a circular arc shape, a sinusoid shape and a wave shape.

Advantageous Effects

The embodiments of the disclosure provide a wire for use in an organic light-emitting diode (OLED) device, wherein the wire comprises three parts, a first part and a third part are located at both ends of the wire respectively and each of the first part and third part is a single wire; the second part is located between the first part and the third part and is a composite wire, wherein the composite wire comprises at least two sub-wires. By dividing a middle part of one wire into multiple sub-wires, the purpose of changing a wire width of a single wire is achieved, which not only has no influence on use of the wires in the OLED device, but also enhances ductility of the wires, thereby efficiently avoiding the occurrence of the problem that the OLED device cannot normally work caused by wire fracture during folding, and efficiently improving the using efficiency of the OLED.

BRIEF DESCRIPTION OF THE DRAWINGS

In order to more clearly describe the technical solution in the embodiments of the disclosure, in the following, a brief introduction will be made to the accompanying drawings used in the embodiments. It is apparent that the drawings in the description below are merely some embodiments of the disclosure, a person skilled in the art can obtain other drawings according to these drawings without paying creative work.

DETAILED DESCRIPTION

To achieve an object of the disclosure, the embodiments of the disclosure provide a wire for use in an organic light-emitting diode (OLED) device and a method for manufacturing the wire, wherein the wire comprises three parts, and a first part and a third part are located at both ends of the wire respectively and each of the first part and third part is a single wire; a second part is located between the first part and the third part and is a composite wire, wherein the composite wire comprises at least two sub-wires. By dividing a middle part of one wire into multiple sub-wires, the purpose of changing a wire width of a single wire is achieved, which not only has no influence on use of the wire in the OLED device, but also enhances ductility of the wire, thereby efficiently avoiding the occurrence of the problem that the OLED device cannot normally work caused by wire fracture during folding, and efficiently improving the using efficiency of the OLED.

Each embodiment of the disclosure will be further described in detail below in combination with the accompanying drawings. It will be apparent that the described embodiments are merely a part of the embodiments of the disclosure, not the entirety of the embodiments. On the basis of the embodiments of the disclosure, all of the other embodiments obtained by a person skilled in the art without paying creative work shall fall within the protection scope of the disclosure.

Figure 1:
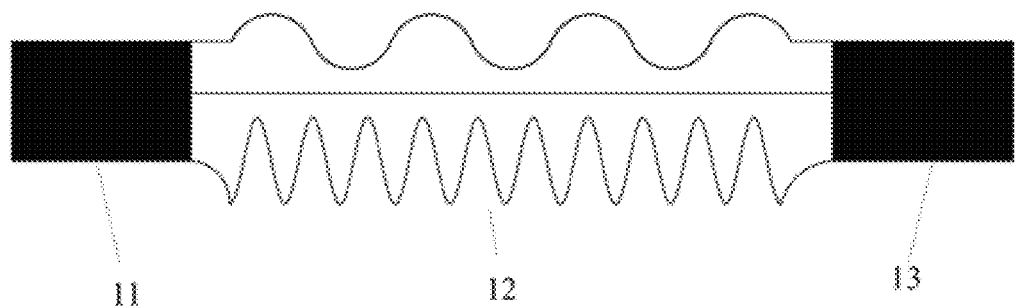
FIG. 1 is a structural schematic view of a wire provided in a first embodiment of the disclosure.

FIG. 1 is a structural schematic view of a wire provided in a first embodiment of the disclosure. The wire comprises three parts, wherein a first part 11 and a third part 13 are located at both ends of the wire respectively and each of the first part 11 and third part 13 is a single wire; a second part 12 is located between the first part and the third part and is a composite wire, wherein the composite wire comprises at least two sub-wires.

A wire, as a relatively important element inside the OLED device, determines whether the OLED device is able to work normally. A study teaches that the wire widths and bending lives of wires have following relationships, as shown in Table 1:

TABLE 1

|  | 3 μm | 5 μm | 10 μm |
| --- | --- | --- | --- |
| Folded wire | 65000 times | 10000 times | 5000 times |
| Straight wire | 75000 times | 65000 times | 30000 times |
| Curved wire | 95000 times | 70000 times | 35000 times |

As can be seen from Table 1, for the wires having the same shapes, the larger the wire widths of the wires are, the shorter the bending lives of the wires are, which is mainly because defects inside metal lines in the wires are increased, since the wire widths are increased, leading to relative concentration of the stress in the curved areas, cracks being prone to propagate, reducing the bending lives of the wires; the wires having the longest bending lives among the wires having the same wire widths belong to the curved wires, which is mainly because the curved wires are relatively suitable for releasing the stress when the wires are bent and fatigued; the stress of the folded wires are easily concentrated and accumulated at corners, thereby generating cracks and leading to fatigue failure, and reducing the bending lives of the wires.

Moreover, in the OLED device, the both ends for making the wire to be fixed (i.e., the first part and the third part), when being fixed, are also prone to fracture owing to being too thin. Thus the first part and the third part use a single wire, and the second wire uses a composite wire, so as to prolong the bending lives of the wires inside the OLED device.

Optionally, a shape of each sub-wire in the composite wire may be a smooth curve.

Optionally, the shapes of the sub-wires in the composite wire may comprise one or more shapes selected from a group consisting of a circular arc shape, a sinusoid shape and a wave shape.

It should be noted that the shapes of the sub-wires in the composite wire may also be elliptical, circular, hyperbolic and parabolic, etc. and is not limited herein.

Optionally, the total wire width of the sub-wires in the composite wire may be or not be the same as the wire width of the single wire.

In this way, in one wire, a middle part uses a smooth curve. When a middle part is bent, the stress distribution may become even, thereby avoiding a phenomenon of stress concentration and effectively avoiding the occurrence of the wire fracture.

In addition, since a middle part of the wire uses a composite wire, other wires may be in normal use even if fracture occurs to one of the wires, which will not affect normal use of the entire OLED device.

Figure 2:
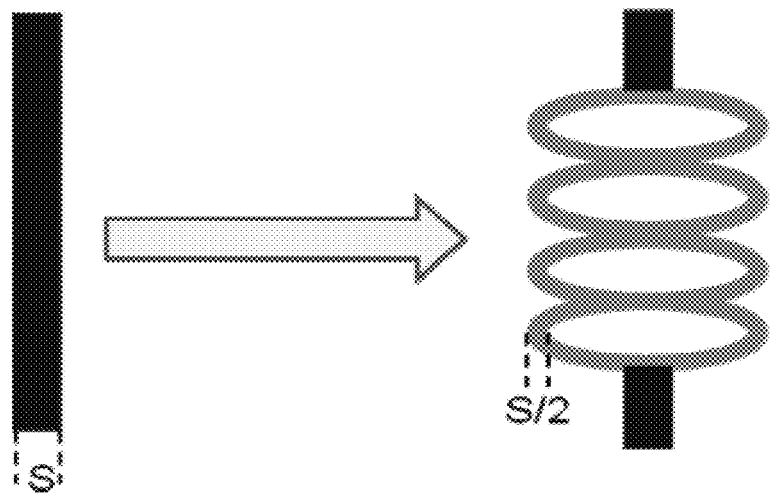
FIG. 2 is a structural schematic view of a wire provided in a second embodiment of the disclosure.

FIG. 2 is a structural schematic view of a wire provided in a second embodiment of the disclosure.

As can be seen from FIG. 2, cross-sectional areas of the first part and the third part of the wire are S, and a cross-sectional area of the second part is S/2; wherein the shape of the second part of the wire is elliptical.

Figure 3:
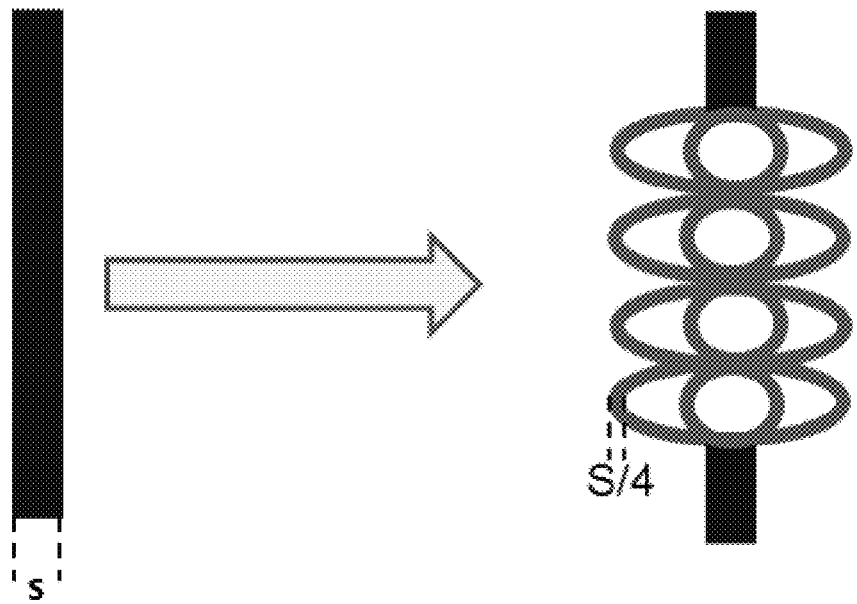
FIG. 3 is a structural schematic view of a wire provided in a third embodiment of the disclosure.

FIG. 3 is a structural schematic view of a wire provided in a third embodiment of the disclosure.

As can be seen from FIG. 3, cross-sectional areas of the first part and the third part of the wire are S, and a cross-sectional area of the second part is S/4; wherein the shape of the second part of the wire is elliptical and circular.

The wires shown in FIG. 2 and FIG. 3 not only have no effect on use of the wires in the OLED device, but also enhance ductility of the wires, and the parts having been folded and curved of the wires are made into elliptical shape, the problem that the OLED device cannot normally work caused by wire fracture during folding can be avoided efficiently, thereby efficiently improving the using life of the OLED.

The embodiments of the disclosure provide a wire for use in an organic light-emitting diode (OLED) device, wherein the wire comprises three parts, and a first part and a third part are located at both ends of the wire respectively and each of the first part and the third part is a single wire; a second part is located between the first part and the third part and is a composite wire, wherein the composite wire comprises at least two sub-wires. By dividing a middle part of one wire into multiple sub-wires, the purpose of changing a wire width of a single wire is achieved, which not only has no influence on use of the wires in the OLED device, but also enhances ductility of the wires, thereby efficiently avoiding the occurrence of the problem that the OLED device cannot normally work caused by wire fracture during folding, and efficiently improving the using life of the OLED.

Figure 4:
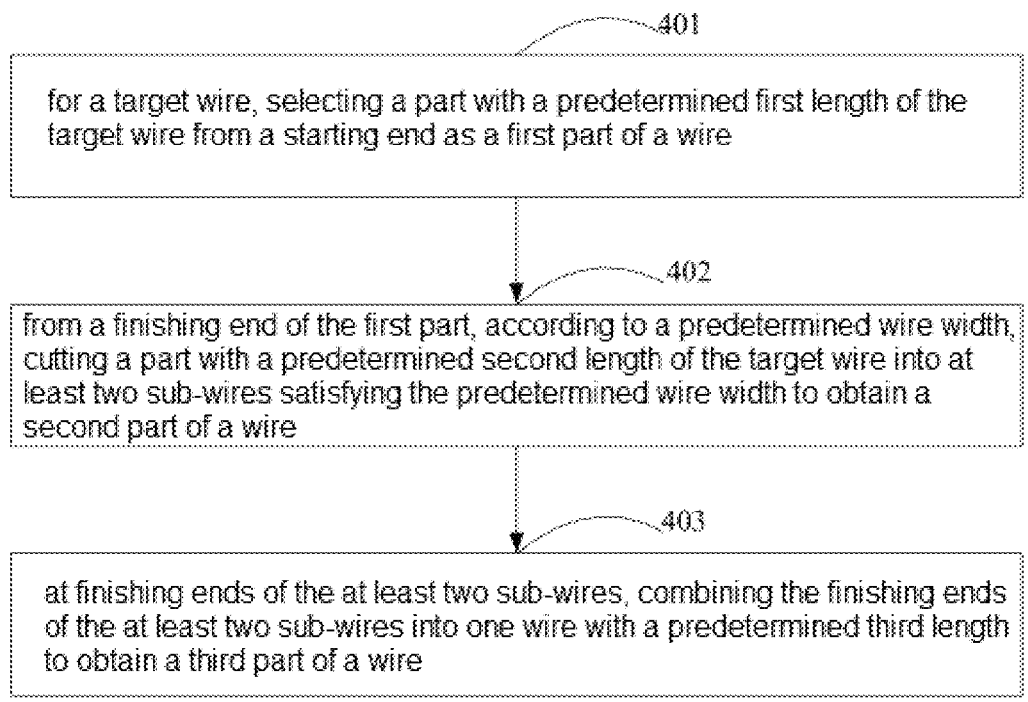
FIG. 4 is a schematic flowchart of a method for manufacturing a wire provided in embodiments of the disclosure.

FIG. 4 is a schematic flowchart of a method for manufacturing a wire provided in an embodiment of the disclosure. The method may be as follows.

Step 401: for a target wire, selecting a part with a predetermined first length of the target wire from a starting end as a first part of the wire.

The predetermined length here may be set according to requirements for the OLED device and is not limited by the embodiment of the disclosure.

Step 402: from a finishing end of the first part, according to a predetermined wire width, cutting a part with a predetermined second length of the target wire into at least two sub-wires satisfying the predetermined wire width to obtain a second part of the wire.

Wherein the wire widths of the at least two sub-wires are the same or different.

In Step 402, cutting a part with a predetermined second length of the target wire into at least two sub-wires satisfying the predetermined wire width may be made by adopting a manner of photo etching or other manners, and may also be made by employing a mask with a pattern of this wire to manufacture directly, which is not limited herein.

Optionally, when cutting a part with a predetermined second length of the target wire into the at least two sub-wires satisfying the predetermined wire width is performed, the method further comprises:

making the at least two sub-wires obtained by cutting into smooth curves.

Optionally, shapes of the at least two sub-wires comprise one or more shapes selected from a group consisting of a circular arc shape, a sinusoid shape and a wave shape.

Step 403: at finishing ends of the at least two sub-wires, combining the finishing ends of the at least two sub-wires into one wire with a predetermined third lenght to obtain a third part of the wire.

The solution of manufacturing a wire provided by the embodiment of the disclosure not only has no influence on use of the wires in the OLED device, but also enhance ductility of the wires, thereby efficiently avoiding the occurrence of the problem that the OLED device cannot normally work caused by wire fracture during folding, and efficiently improving the using efficiency of the OLED.

It should be understood by a person skilled in the art that the embodiments of the disclosure may be provided as a method, an apparatus (device), or a computer program product. Thus, the disclosure may take the form of an embodiment of full hardware, an embodiment of full software or an embodiment of combination of hardware and software. Moreover, the present application may take the form of a computer program product implemented on one or more computer usable storage media (including but not limited to disk storage, CD-ROM, optical memory, and the like) including computer usable program codes.

The present application is described with reference to the flowchart and/or the block diagram of the methods, apparatus (devices) and computer program products according to the embodiments of the present application. It should be understood that each process and/or block in the flowchart and/or block diagram, and a combination of process and/or block in the flowchart and/or block diagram can be implemented by computer program instructions. The computer program instructions may be provided to a processor of a general purpose computer, a special purpose computer, an embedded processor or other programmable data processing devices to generate one machine, so as to enable the instructions implemented by the processor of the computer or other programmable data processing devices to generate a device for achieving the specified function in one or more processes in the flowchart and/or in one or more blocks in the block diagram.

These computer program instructions may also be stored in a computer readable memory capable of guiding the computer or other programmable data processing devices to work in a specific manner, so as to enable the instructions stored in the computer readable memory to generate a manufactured product including a command device. The command device is capable of achieving the specified functions in one or more processes in the flowchart and/or in one or more blocks in the block diagram.

These computer program instructions may also be loaded into the computer and other programmable data processing devices such that a series of operating steps may be performed on the computer or other programmable data processing devices to generate a compute-achievable treatment, and thus the instructions performed on the computer or other programmable devices provide steps of the specified function in one or more processes in the flowchart and/or in one or more blocks in the block diagram.

Although the preferred embodiments of the disclosure have been described, additional modifications and changes to the embodiments may be made by a person skilled in the art once he/she knows the fundamental inventive concept. Thus the accompanying claims are intended to be interpreted as including the preferred embodiments and all of the modifications and changes falling into the protection scope of the present application.

It will be apparent that various modifications and changes may be made by a person skilled in the art without departing from the spirit and scope of the disclosure. Thus the present application is also intended to include its modifications and changes if these modifications and changes of the present invention fall into the scope of the claims of the present application and their equivalents.

What is claimed is:

1. A wire for use in an organic light-emitting diode (OLED) device, wherein the wire comprises a first part, a second part and a third part, which are connected in this order, wherein the first part and the third part are located at both ends of the wire respectively and each of the first part and third part is a single wire; and wherein the second part is located between the first part and the third part and is a composite wire, wherein the composite wire comprises at least two sub-wires extended in from the single wires, and wherein a wire width of any one of the at least two sub-wires is less than a wire width of any one of the single wires.

2. The wire according to claim 1, wherein a shape of each sub-wire in the composite wire is a smooth curve.

3. The wire according to claim 2, wherein the shapes of the sub-wires in the composite wire comprise one or more shapes selected from a group consisting of a circular arc shape, a sinusoid shape and a wave shape.

4. The wire according to claim 1, wherein a total wire width of the sub-wires in the composite wire is same as the wire width of any one of the single wires.

5. A method for manufacturing a wire according to claim 1, comprising:

for a target wire, selecting a part with a predetermined first length of the target wire from a starting end as a first part of the wire;

from a finishing end of the first part, according to a predetermined wire width, cutting a part with a predetermined second length of the target wire into at least two sub-wires satisfying the predetermined wire width to obtain a second part of the wire, wherein the wire widths of the at least two sub-wires are the same or different;

at finishing ends of the at least two sub-wires, combining the finishing ends of the at least two sub-wires into one wire with a predetermined third length to obtain a third part of the wire.

6. The method for manufacturing a wire according to claim 5, wherein when cutting a part with a predetermined second length of the target wire into the at least two sub-wires satisfying the predetermined wire width is performed, the method further comprises:

making the at least two sub-wires obtained by cutting into smooth curves.

7. The method for manufacturing a wire according to claim 6, wherein shapes of the at least two sub-wires comprise one or more shapes selected from a group consisting of a circular arc shape, a sinusoid shape and a wave shape.

8. The wire according to claim 1, wherein the at least two sub-wires are separated from each other, one end of each of the at least two sub-wires is connected to the first part, and the other end of each of the at least two sub-wires is connected to the third part.

9. The wire according to claim 1, wherein any two adjacent sub-wires are in contact with each other.

10. The wire according to claim 9, wherein each of the at least two sub-wires has a closed shape.

11. The wire according to claim 10, wherein each of the at least two sub-wires has an elliptical shape.

12. The wire according to claim 10, wherein the wire width of each of the at least two sub-wires is half of the wire width of any one of the single wires.

13. The wire according to claim 9, wherein each of the at least two sub-wires comprises a first sub-wire unit and a second sub-wire unit;

wherein each of the first sub-wire unit and the second sub-wire unit has a closed shape;

wherein the first sub-wire unit is around the second sub-wire unit, a portion of the first sub-wire unit and a portion of the second sub-wire unit close to the first part being in contact with each other, and wherein another portion of the first sub-wire unit and another portion of the second sub-wire unit close to the third part are in contact with each other.

14. The wire according to claim 13, wherein the first sub-wire unit has an elliptical shape, and wherein the second sub-wire unit has a circular shape.

15. The wire according to claim 13, wherein a wire width of each of the first sub-wire unit and the second sub-wire unit is a quarter of the wire width of any one of the single wires.

* * * * *